(12) United States Patent
Asanza Maldonado

(10) Patent No.: US 9,985,544 B2
(45) Date of Patent: May 29, 2018

(54) ELECTRONIC SWITCH

(71) Applicant: Ellenberger & Poensgen GmbH, Altdorf (DE)

(72) Inventor: Diego Fernando Asanza Maldonado, Nuremberg (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 0 days. days.

(21) Appl. No.: 15/450,380

(22) Filed: Mar. 6, 2017

(65) Prior Publication Data
US 2017/0179837 A1 Jun. 22, 2017

Related U.S. Application Data

(63) Continuation of application No. PCT/EP2015/068592, filed on Aug. 12, 2015.

(30) Foreign Application Priority Data

Sep. 5, 2014 (DE) .................... 20 2014 007 096 U

(51) Int. Cl.
*H02H 3/08* (2006.01)
*H02M 3/335* (2006.01)

(52) U.S. Cl.
CPC ............................. *H02M 3/33576* (2013.01)

(58) Field of Classification Search
CPC ............ G05F 1/445; G05F 1/56; G05F 1/573; H02H 11/00; H02H 3/08; H01H 71/123; H01H 83/20
See application file for complete search history.

(56) References Cited

U.S. PATENT DOCUMENTS

| | | | | |
|---|---|---|---|---|
| 4,352,054 A * | 9/1982 | Grunsch | ............... | H02M 3/155 323/224 |
| 4,399,500 A * | 8/1983 | Clarke | .................. | H02M 3/155 323/289 |
| 4,716,304 A | 12/1987 | Fiebig et al. | | |
| 4,979,068 A * | 12/1990 | Sobhani | ................. | H02H 3/087 361/111 |
| 6,125,024 A * | 9/2000 | LeComte | ............... | H02H 3/025 361/104 |
| 6,351,107 B1 * | 2/2002 | Okita | ............... | H03K 17/04213 323/282 |
| 6,490,141 B2 | 12/2002 | Fischer et al. | | |

FOREIGN PATENT DOCUMENTS

DE   31 21 754 C1   12/1982
DE   35 22 429 A1   1/1987
(Continued)

*Primary Examiner* — Gary L Laxton
(74) *Attorney, Agent, or Firm* — Muncy, Geissler, Olds & Lowe, P.C.

(57) ABSTRACT

An electronic switch for switching a load, having a current path which runs between an operating voltage connection and a load connection and to which a power transistor and a current sensor sensing the load current are connected, and having a control or regulating device which controls the power transistor on the basis of the load current, wherein the control or regulating device is connected to the secondary circuit of a converter circuit having a transformer, the primary circuit of which is connected to the operating voltage connection via a controlled switch arrangement.

10 Claims, 2 Drawing Sheets

(56) References Cited

FOREIGN PATENT DOCUMENTS

| | | |
|---|---|---|
| DE | 203 02 275 U1 | 7/2003 |
| DE | 10 2011 114 366 A1 | 5/2012 |
| EP | 1 186 086 B1 | 12/2002 |
| JP | 11-69795 A | 3/1999 |
| KR | 10-2014-0006082 A | 1/2014 |

* cited by examiner

ELECTRONIC SWITCH

This nonprovisional application is a continuation of International Application No. PCT/EP2015/068592, which was filed on Aug. 12, 2015, and which claims priority to German Patent Application No. 20 2014 007 096.2, which was filed in Germany on Sep. 5, 2014, and which are both herein incorporated by reference.

BACKGROUND OF THE INVENTION

Field of the Invention

The invention relates to an electronic switch for switching a load, with a current path extending between a direct voltage terminal and a load terminal, in which a power transistor and a current sensor sensing the load current are connected, and having a control or regulating device which controls the power transistor that is dependent on the load current.

Description of the Background Art

Such an electronic switch, which is also referred to as an electronic circuit breaker or electronic relay, is used to switch a load and operates in the low voltage range (DC 24V). Such a switch is particularly suitable for use in a power distribution system, as is known, for example from EP 1 186 086 B1, which corresponds to U.S. Pat. No. 6,490,141, which is incorporated herein by reference. In this known power distribution system, a number of circuits are jointly powered by a direct current by means of, for example, a switched-mode power supply, wherein the electronic switches used also take on the functionality of an electronic circuit breaker in order to control an overload current and a short circuit in a single circuit, and in case of overload or short circuit, reliably, possibly following an active current limitation, to trigger said breaker.

In conjunction with a linear power supply, such an electronic switch is known from DE 20 302 275 A1. In a current path extending between a service terminal and a load terminal, said switch includes a power transistor (MOSFET) and a regulating device, to which for current-limiting control of the power switch (semiconductor switch), a measured value detected by a current sensor in the current path is supplied. The regulating device, which according to an embodiment includes an operational amplifier operating as a comparator, is connected to its voltage supply with a charge pump to obtain the necessary increase in voltage at its control input for the operation of the power transistor, which in turn allows for the use of a comparatively inexpensive N-channel variant of a field effect transistor (MOSFET) as the load switching element.

In practical operation of such an electronic switch with a charge pump, it has been found not only to have an undesirably high circuit topological effort, but also that the power losses of particularly 450 mW to 500 mV when connecting the known electronic switch to a 24V DC voltage network are undesirably high.

SUMMARY OF THE INVENTION

It is therefore an object of the invention to provide a particularly low-loss electronic switch (electronic relay) which is produced, in particular in respect of circuitry, with little effort and high efficiency. Preferably, the electronic switch shall also be able to take on the functionality of an electronic circuit breaker in a simple manner.

In an exemplary embodiment, the electronic switch that operates to switch a load of the type of an electronic relay has a power transistor designed particularly as a field effect transistor (MOSFET), in a current path extending between a DC terminal and a load terminal, and a load current sensing current sensor, which measurement signal is guided to a control or regulating device controlling the power transistor. This is connected to the secondary circuit of a converter circuit with galvanic isolation in the form of a transformer which primary circuit is guided via a controlled, particularly a self-controlled, switch assembly to the DC voltage terminal.

The invention is based on the consideration that for the production of an electronic switch operating with the least possible loss, its supply circuit should not operate in the form of a linear power supply, but according to the principle of a switching power supply. Thus, as known, an electronic switch or an electronic circuit breaker operating according to the converter principle (DC-DC converter) underlying a switching power supply may be constructed not only with the least possible loss, but also with high efficiency.

The converter circuit of the electronic switch (circuit breaker) can be controlled by means of corresponding electronics or can be designed to be self-controlled. The converter circuit therefore suitably operates according to the flyback or resonant converter principle of a DC-DC converter with galvanic isolation. In case of a preferred, self-directed converter circuit, expediently, two transistors operating on the primary winding of the transformer, and/or at least one component to form a resonant circuit, are connected to the primary circuit of the converter circuit of the electronic switch.

From the input-side operating DC voltage of the load side switching circuit breaker, e.g., a 24 $V_{DC}$ input voltage, the converter circuit generates therefrom an output voltage preferably generated according to the principle of a step-down converter or buck converter to power the control or regulating device for the circuit breaker, e.g., a 5 $V_{DC}$ supply or operating voltage. Suitably, therefore, the control or regulating device has an output side operational amplifier connected to the control input of the power transistor, at which supply terminals the output voltage of the converter circuit is carried.

In an advantageous design of this embodiment of the control or regulating device of the electronic switch, the operational amplifier controls the power switch as a function of a deviation of the load current from a reference value. To this end, suitably one of the comparator inputs of the operational amplifier is routed to a reference-value-forming tap of a voltage divider that is connected in the secondary circuit of the converter circuit. In case an electronic circuit is integrated into the converter circuit of the electronic switch, which can then also be used as a protective switch, the reference value can also be specified by the electronics.

Preferably, a control electronics suitably connected to the primary circuit of the converter circuit is provided for performing circuit breaker functions, in particular for limiting current and/or for controlling the switch arrangement of the converter circuit. The electronic switch is thus programmable via the electronics in terms of the rated current and/or a current limitation for implementing an overload or short circuit protection, for example, via a bus system.

In an embodiment, a device, for example a diode, for regulating the output voltage of the converter circuit is connected to the direct-voltage terminal, and/or to the primary winding of the transformer of the converter circuit, and/or at least one component, for example a capacitor, which forms a (resonant) oscillating circuit with the primary winding of the transformer, is connected to the primary circuit of the converter circuit.

The advantages achieved with the invention are, in particular, that the design of an electronic switch or circuit breaker can be combined with a converter circuit of the voltage supply for the power transistor (semiconductor switch) and for the control or regulation electronics in a power supply, preferably in the manner of a switching power supply, and more particularly to a DC 24V supply or operating voltage terminal. In addition, the electronic circuit breaker can be operated free of a charge pump and constructed low-cost in terms of circuitry. Furthermore, a reduction in power losses of about 50%, for example from 480 mW to 240 mW, can be achieved by means of the electronic switch or circuit breaker according to the invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
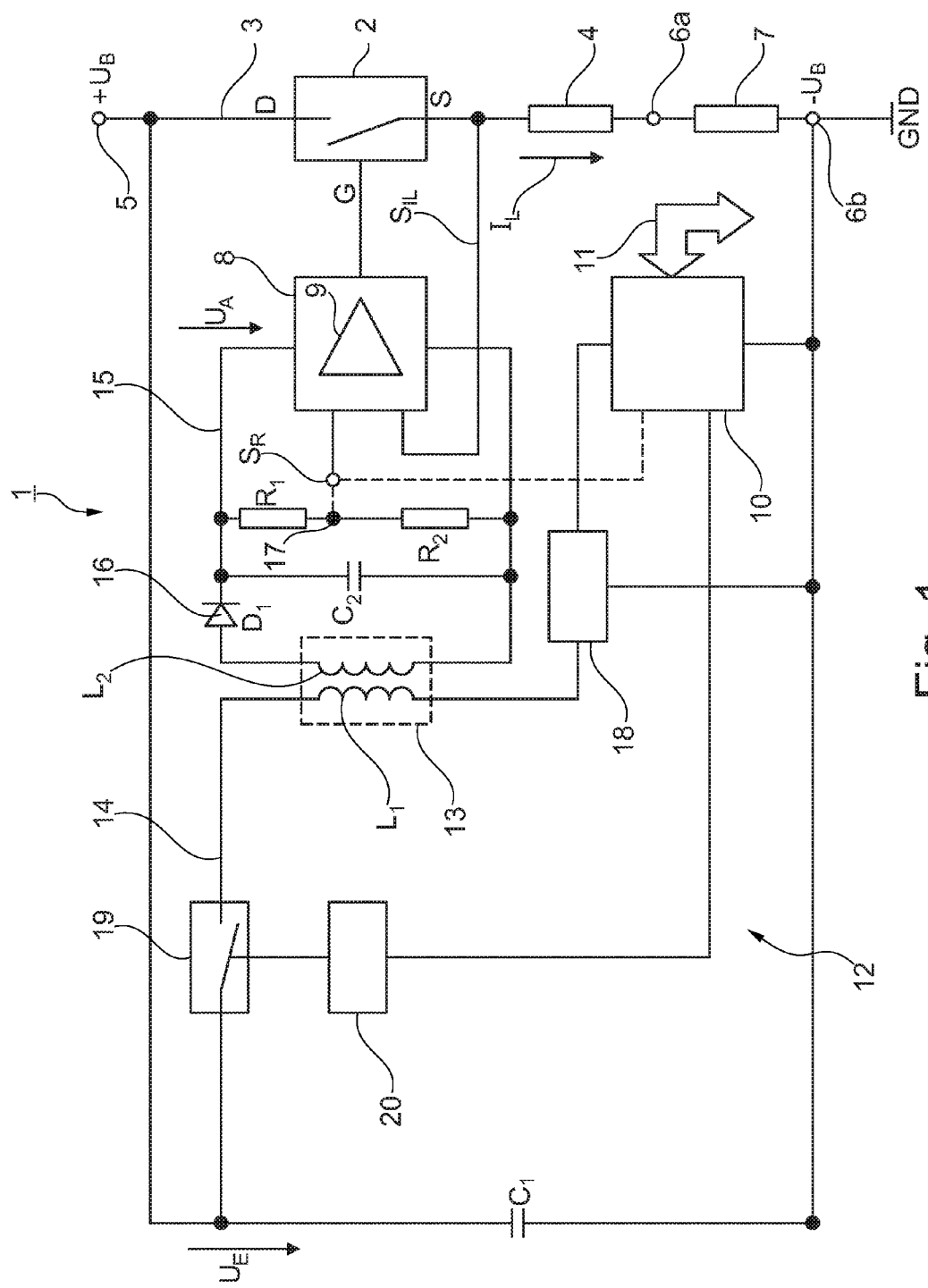
FIG. 1 is a block diagram of an electronic switch (circuit breaker) operating according to the transducer principle with an electronic system for controlling the primary-side switch of a converter circuit.
Figure 2:
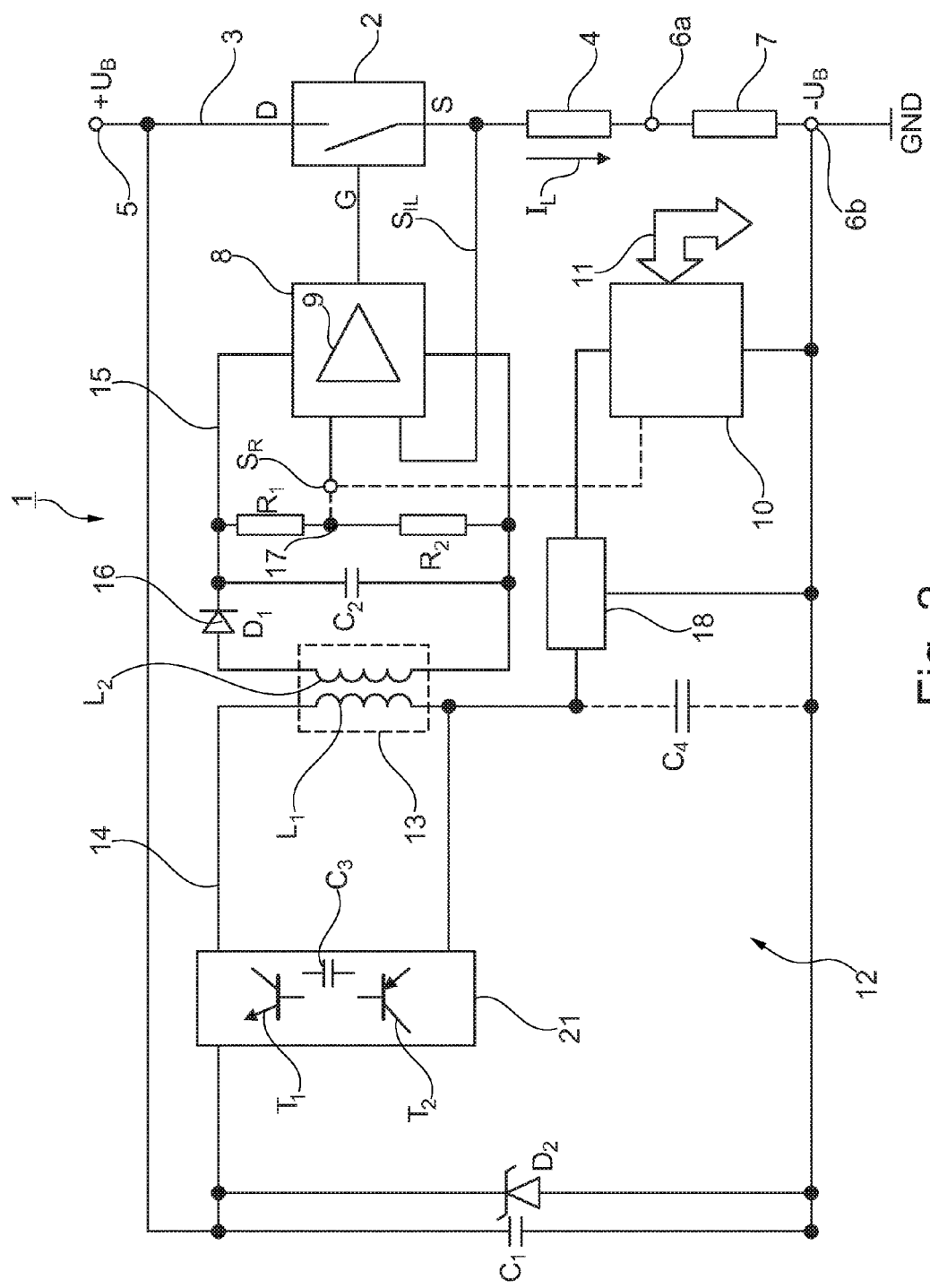
FIG. 2 is a representation according to FIG. 1 of the electronic switch (circuit breaker) with a self-directed converter circuit.

The electronic switch 1 schematically illustrated in FIGS. 1 and 2 comprises a power transistor or semiconductor switch 2, in particular a MOSFET, which is connected with a current path 3 on the drain-source side. In this current path 3, a current sensor 4 is connected downstream of the power transistor 2, for example in the form of a shunt. The current path 3 extends between an operating voltage terminal 5 and a positive load output 6a to which the positive pole of a load 7 to be switched is connected, while its negative pole must be connected to a corresponding negative load terminal 6b of the electronic switch 1. This load terminal 6b is guided to reference potential ($-U_B$) or to ground GND. The positive operating voltage ($+U_B$) with particularly $U_B=24\ V_{DC}$, is applied as a direct voltage (DC) to the operating voltage terminal 5 of the switch 1.

When the load 7 is connected and the switch 1 closed, that is, when controlling the power transistor 2 of said switch in the forward direction, a load current $I_L$ flows starting from the operating voltage terminal 5, over the current path 3 and the load 7, to reference potential or ground GND. The current $I_L$ flowing over the current path 3 and the load 7 is guided by means of the current sensor 4 as a measured value or as a corresponding measurement signal $S_{IL}$ in the form of the voltage drop across the shunt 4 to a control or regulating device 8.

The control or regulating device 8 essentially comprises an operational amplifier 9 to which comparator input, the measurement signal $S_{IL}$ is supplied, and to which other comparator input, a reference value $S_R$ is supplied. The reference value $S_R$ as well as a control signal can be generated by an electronic control system 10 for turning the power transistor 2 on and off. This electronic control unit 10, for example, is provided with connections for a bus system 11, through which external signals can be provided to the electronic switch 1 and/or diagnostic or error signals can be transferred to a higher-order device.

The power transistor 2 is connected to the drain terminal D of the operating voltage connection 5 and with the source terminal S of said voltage connection via the current sensor 4 to the positive load terminal 6a. The gate G as the control input of the power transistor 2 is connected to the output of the control or regulating device 8. Thus, the operational amplifier 9 of said regulating device is connected on the output side to the control input G of the power transistor 2.

The voltage supply of the control or regulating device 8, or of the operational amplifier 9, is effected by means of a converter circuit 12 with a transformer 13. On the input side, the converter circuit 12 is guided to the operating voltage connection 5 and through a capacitor $C_1$ and optionally other passive components—for example via the load terminal 6d—to ground GND. The input voltage $U_E$ of the converter circuit 12 thus corresponds to the operating voltage $U_B$. The galvanic isolation between the primary circuit 14 and a secondary circuit 15 of the converter circuit 12 takes place via the transformer 13. In its secondary circuit 15, the control or regulating device, and thus its operational amplifier 9, is connected.

The secondary circuit 15 of the converter circuit 12 otherwise primarily includes a rectifier 16 in the form of a diode $D_1$ and a filter or smoothing capacitor $C_2$. According to an embodiment, a voltage divider $R_1$, $R_2$ also connected in the secondary circuit 15 is provided for forming the reference value $S_R$, in which the tap 17 is connected to the reference input of the control or regulating device 8, or to its operational amplifier 9. By selecting the resistance ratio $R_1$, $R_2$, for example, the nominal current ($I_N$) of the electronic switch 1 can be predetermined or set, for example, by one of the two resistors $R_1$, $R_2$ being designed as a potentiometer.

However, the reference value $S_R$ can preferably also set a threshold value of an active current limiting of the switch 1, wherein this threshold, for example, may amount to 1.5 times to 2 times the respective nominal current $I_N$. In case of an overload or short-circuit, the load current $I_L$ flowing through the current path 3 can thus be actively limited by means of the power transistor 2 in that said power transistor is fed accordingly by means of the control or regulating device 8 by the, for example, previously fully conductive state. The current limitation then occurs based on a set or a predetermined reference value $S_R$, wherein after a set tripping time has passed, a complete blocking of the power transistor 2 occurs and the load is disconnected 7 (triggering event).

The converter circuit 12 operates suitably in the manner of a switching power supply with downward control so that the input voltage $U_E$ of the converter circuit 12 corresponding to the operating voltage $U_B$ is transformed on the secondary side into a comparatively low output voltage $U_A$. By means of this, the control or regulating device 8 is supplied with energy. The output voltage $U_A$ of the converter circuit 12 can be, for example, 5V. However, the converter circuit 12 can also operate as a boost regulator, to achieve, for example, a higher voltage at its gate G than at its drain D, depending on the type of transistor used.

Whereas the secondary winding $L_2$ of the transformer 13 is connected in the secondary circuit 15, the primary winding $L_1$ of the transformer 3 is connected in the primary circuit 14. In the primary circuit 14 of the converter circuit 12, a smoothing and/or rectifier circuit 17 is provided, which, for example, can be constructed of resistors and capacitors and diodes (Zener diodes) and can be used to power the electronics 10. In the primary circuit 14 of the converter circuit 12, there is also a diode $D_2$ for regulating the output voltage $U_A$.

Whereas in the embodiment of FIG. 1, the converter circuit 12 is designed according to the flyback converter principle with a transistor or power transistor 19 switched in the primary circuit 14, the converter circuit 12 operates in accordance with the embodiment of FIG. 2 according to the resonance or forward converter principle. In this embodiment, the transistor 19 is controlled with rectangular pulses which pulse frequency is in particular greater than or equal to 16 kHz. An AC voltage accordingly generated corresponding to the primary side is transformed to the secondary side of the transistor 13 and is rectified there to be available as an output voltage $U_A$ (direct current, DC).

In the embodiment according to FIG. 1, the transistor (power transistor) 19 of the converter circuit 12 switched in the primary circuit 14 is connected on the control side with a driver in the form of, for example, a pulse-width modulator (PWM) 20, which in turn is connected to the electronics 10 and driven by the latter.

In the embodiment according to FIG. 2, a capacitor $C_3$ and/or $C_4$, together with the inductance of the transformer 13, in particular its primary winding $L_1$, forms an oscillating circuit. The inductance can be formed by an additional coil. In this embodiment, two transistors $T_1$, $T_2$, suitably operate, for example, in a push-pull manner to produce a primary-side AC voltage on the primary winding $L_1$ of the transformer 13. The AC voltage transformed to the secondary side of the transistor 13 is rectified again and is available as an output voltage $U_A$ (direct current, DC). For this purpose, in a non-illustrated manner, the transistors $T_1$ and $T_2$ are connected within a transistor circuit 20 with further components (resistors, capacitors) such that, for example, one of the two transistors is always switched on, while the other transistor locks, and vice versa.

The invention is not limited to the embodiments described above. Rather, other variations of the invention can be derived therefrom by the skilled artisan without departing from the scope of the invention. In particular, further, all individual features described in connection with the embodiments can be combined with one another in other ways without departing from the scope of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An electronic switch for switching a load, the electronic switch comprising:
   a current path extending between an operating voltage terminal and a load terminal in which a power transistor and a flow sensor sensing a load current are connected; and
   a control or regulating device that controls the power transistor dependent on the load current, the control or regulating device being connected in a secondary circuit of a converter circuit to a transformer and to a primary circuit that is guided to the operating voltage terminal via a controlled switch arrangement.

2. The electronic switch according to claim 1, wherein the control or regulating device comprises an operational amplifier connected on an output side with a control input of the power transistor, to which for a supply, an output voltage of the converter circuit is guided.

3. The electronic switch according to claim 2, wherein the operational amplifier drives a circuit breaker from a reference value as a function of a deviation of the load current.

4. The electronic switch according to claim 3, wherein one of a comparator inputs of the operational amplifier is guided to a tap that forms the reference value of a voltage divider that is connected in the secondary circuit of the converter circuit.

5. The electronic switch according to claim 1, further comprising control electronics connected in the primary circuit of the converter circuit for performing circuit breaker functions, for current limitation, and/or for controlling the switch arrangement of the converter circuit.

6. The electronic switch according to claim 1, wherein, in the primary circuit of the converter circuit and/or to a primary winding of the transformer of the converter circuit, a diode is connected for regulating an output voltage.

7. The electronic switch according to claim 1, wherein, in the primary circuit of the converter circuit, two transistors operating on the primary winding of the transformer are connected.

8. The electronic switch according to claim 1, wherein the converter circuit operates according to a flyback, resonant or forward converter principle.

9. The electronic switch according to claim 1, wherein the converter circuit is self-directing.

10. The electronic switch according to claim 1, wherein, in the primary circuit of the converter circuit, a capacitor is connected to form a resonant circuit with a primary side transformer inductance.

* * * * *